United States Patent
Im et al.

(10) Patent No.: US 12,468,226 B2
(45) Date of Patent: Nov. 11, 2025

(54) PHOTORESIST COMPOSITIONS AND METHODS OF FABRICATING A SEMICONDUCTOR DEVICE

(71) Applicant: Samsung Electronics Co., Ltd., Suwon-si (KR)

(72) Inventors: Honggu Im, Hwaseong-si (KR); Sumin Kim, Suwon-si (KR); Yechan Kim, Hwaseong-si (KR); Jinjoo Kim, Seoul (KR); Hyunwoo Kim, Seongnam-si (KR); Sunghwan Park, Suwon-si (KR); Juhyeon Park, Hwaseong-si (KR); Jicheol Park, Anyang-si (KR); Giyoung Song, Anyang-si (KR); Sukkoo Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 421 days.

(21) Appl. No.: 18/056,332

(22) Filed: Nov. 17, 2022

(65) Prior Publication Data
US 2023/0152694 A1 May 18, 2023

(30) Foreign Application Priority Data
Nov. 18, 2021 (KR) .......... 10-2021-0159817

(51) Int. Cl.
*G03F 7/039* (2006.01)
*G03F 7/038* (2006.01)

(52) U.S. Cl.
CPC .......... *G03F 7/0392* (2013.01); *G03F 7/0384* (2013.01)

(58) Field of Classification Search
CPC .............................. G03F 7/0397; G03F 7/038
See application file for complete search history.

(56) References Cited

U.S. PATENT DOCUMENTS 4,101,323 A * 7/1978 Buhr ...................... G03F 7/0045
430/296
4,311,782 A * 1/1982 Buhr ...................... G03F 7/0045
430/176

(Continued)

FOREIGN PATENT DOCUMENTS

| JP | H07140664 A | 6/1995 |
| JP | H11160876 A | 6/1999 |
| JP | 2009222822 A | 10/2009 |

*Primary Examiner* — John S. Chu
(74) *Attorney, Agent, or Firm* — Wolf, Greenfield & Sacks, P.C.

(57) ABSTRACT

Photoresist compositions may include a photosensitive polymer including a first repeating unit of Chemical Formula 1; a photoacid generator (PAG); and a solvent.

13 Claims, 8 Drawing Sheets

<Chemical Formula 1>

(56) References Cited

U.S. PATENT DOCUMENTS

| | | | |
|---|---|---|---|
| 5,260,410 A * | 11/1993 | Schwalm | G03F 7/039 |
| | | | 528/33 |
| 6,511,785 B1 | 1/2003 | Takemura et al. | |
| 7,422,836 B2 | 9/2008 | Rhodes et al. | |
| 9,063,414 B2 | 6/2015 | Ichikawa et al. | |
| 9,213,235 B2 | 12/2015 | Hasegawa et al. | |
| 9,663,656 B2 | 5/2017 | Hatakeyama et al. | |
| 10,025,187 B2 | 7/2018 | Nagahara et al. | |
| 2001/0041300 A1* | 11/2001 | Kodama | G03F 7/039 |
| | | | 430/905 |
| 2017/0131633 A1* | 5/2017 | Nakagawa | G03F 7/0045 |
| 2019/0391488 A1 | 12/2019 | Nishikori et al. | |
| 2020/0231720 A1 | 7/2020 | Masuyama et al. | |

\* cited by examiner

PHOTORESIST COMPOSITIONS AND METHODS OF FABRICATING A SEMICONDUCTOR DEVICE

CROSS-REFERENCE TO RELATED APPLICATION

This application is based on and claims priority under 35 U.S.C. § 119 to Korean Patent Application No. 10-2021-0159817, filed on Nov. 18, 2021, in the Korean Intellectual Property Office, the disclosure of which is incorporated by reference herein in its entirety.

BACKGROUND

The inventive concept relates to a photoresist composition and a method of fabricating a semiconductor device, and more particularly, to a photoresist composition in which a proportion of a thickness of a photoresist pattern remaining after development may be increased, and a semiconductor device including a better-quality pattern formed by using the photoresist composition.

Due to the development of electronic technologies, semiconductor devices have been rapidly down-scaled in recent years. Accordingly, a photolithography process that is advantageous for implementing a fine pattern may be beneficial. In particular, a technology capable of increasing photosensitivity in photolithography processes for manufacturing integrated circuit devices and improving a dissolution contrast with respect to a developer between an exposed region and a non-exposed region of a photoresist film may be beneficial.

SUMMARY

The inventive concept provides a photoresist composition in which a proportion of a thickness of a photoresist pattern remaining after the development of an exposed region may be increased while maintaining a solubility of a non-exposed region with respect to a developer.

The inventive concept also provides a semiconductor device having a better-quality pattern.

According to an aspect of the inventive concept, there is provided a photoresist composition including: a photosensitive polymer including a first repeating unit of Chemical Formula 1; a photoacid generator (PAG); and a solvent.

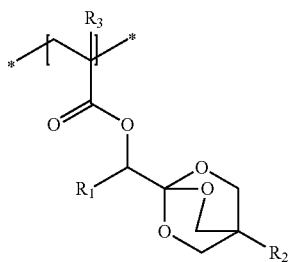

<Chemical Formula 1>

In Chemical Formula 1, $R_1$ is hydrogen, an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, or a cycloalkenyl group having 3 to 12 carbon atoms, $R_2$ is an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, a cycloalkenyl group having 3 to 12 carbon atoms, or a carboxylate group having 1 to 6 carbon atoms, and $R_3$ is hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms.

According to another aspect of the inventive concept, there is provided a photoresist composition including: a photosensitive polymer; a photoacid generator (PAG); and a solvent, wherein the photosensitive polymer includes a first repeating unit including a solubility adjusting moiety, and the solubility adjusting moiety is capable of being converted into a carboxylic acid and/or a diol by reacting with acid.

According to yet another aspect of the inventive concept, there is provided a photoresist composition including: a photosensitive polymer, which is a random copolymer including a first repeating unit of Chemical Formula 1, a second repeating unit of Chemical Formula 2, and a third repeating unit of Chemical Formula 3; a photoacid generator (PAG); a basic quencher; and a solution.

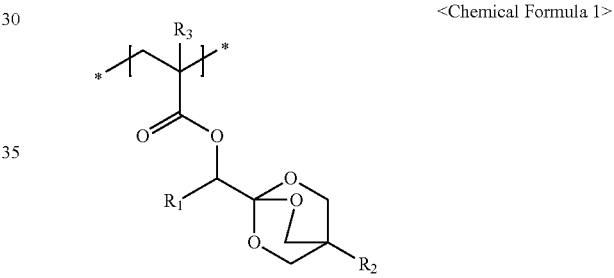

<Chemical Formula 1>

<Chemical Formula 2>

<Chemical Formula 3>

In Chemical Formulae 1 to 3, $R_1$ is hydrogen, an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, or a cycloalkenyl group having 3 to 12 carbon atoms, $R_2$ is an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, a cycloalkenyl group having 3 to 12 carbon atoms, or a carboxylate group having 1 to 6 carbon atoms, $R_3$ is hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms, $R_{4a}$ is hydrogen, a hydroxyl group, a carboxyl group, an alkyl group having 1 to 10 carbon atoms, a cycloalkyl group having 3 to 12 carbon atoms, or an alkoxy group having 1 to 10 carbon atoms, $R_{4b}$ is a hydroxyl group or a carboxyl group, $R^{2a}$ is a hydrogen atom, a linear or branched alkyl group having 1 to 6 carbon atoms, a halogen atom, or a linear or branched alkyl halide group having 1 to 6 carbon atoms, and $R^{2b}$ is an acid-labile protecting group.

BRIEF DESCRIPTION OF THE DRAWINGS

Some embodiments of the inventive concept will be more clearly understood from the following detailed description taken in conjunction with the accompanying drawings in which.

DETAILED DESCRIPTION

Figure 1:
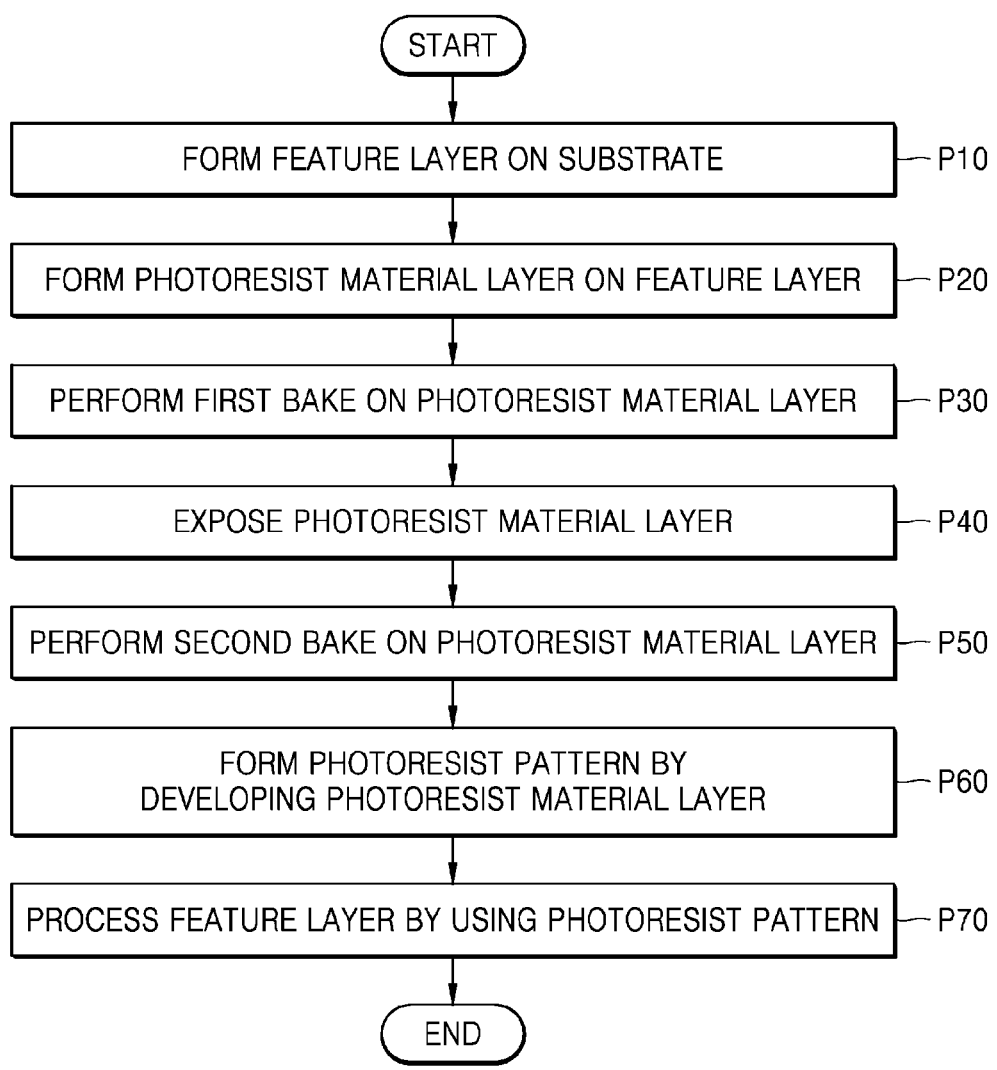
FIG. 1 is a flowchart illustrating a method of fabricating an integrated circuit device, according to some embodiments of the inventive concept.

Hereinafter, some embodiments of the inventive concept will be described in detail with reference to the accompanying drawings. Like components are denoted by like reference numerals throughout the specification, and repeated descriptions thereof may be omitted.

As used herein, "*" denotes the remainder of the molecule to which the structure is bonded.

A photoresist composition according to some embodiments of the inventive concept may include a photosensitive polymer, a photoacid generator (PAG), and a solvent.

Photosensitive Polymer

The photosensitive polymer may be a polymer capable of undergoing a photochemical reaction in response to irradiation by a KrF excimer laser beam (248 nm), an ArF excimer laser beam (193 nm), an F2 excimer laser beam (157 nm), or EUV light (13.5 nm), and in particular, in response to the irradiation by EUV light. In some embodiments, the photosensitive polymer may have an increased solubility in a developer due to the photochemical reaction.

The photosensitive polymer may include a first repeating unit of Chemical Formula 1.

<Chemical Formula 1>

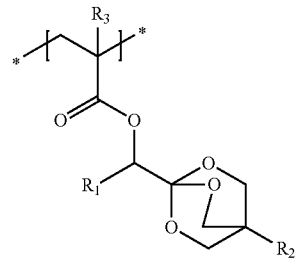

wherein $R_1$ is hydrogen, an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, or a cycloalkenyl group having 3 to 12 carbon atoms, $R_2$ is an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, a cycloalkenyl group having 3 to 12 carbon atoms, or a carboxylate group having 1 to 6 carbon atoms, and $R_3$ is hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms.

In some embodiments, $R_1$ may be hydrogen, a methyl group, an ethyl group, or an aryl group, and $R_2$ may be a methyl group, an ethyl group, a propyl group, a methoxy group, an ethoxy group, a propoxy group, an aryl group, a formate group, or an acetate group.

In some embodiments, the first repeating unit may be represented by one of the following chemical formulae (where X is a halogen element).

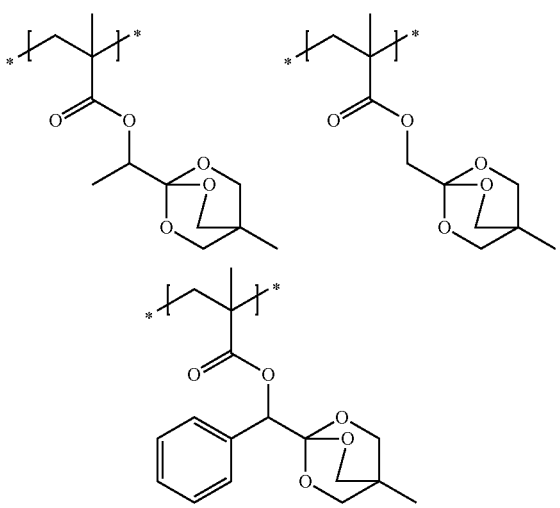

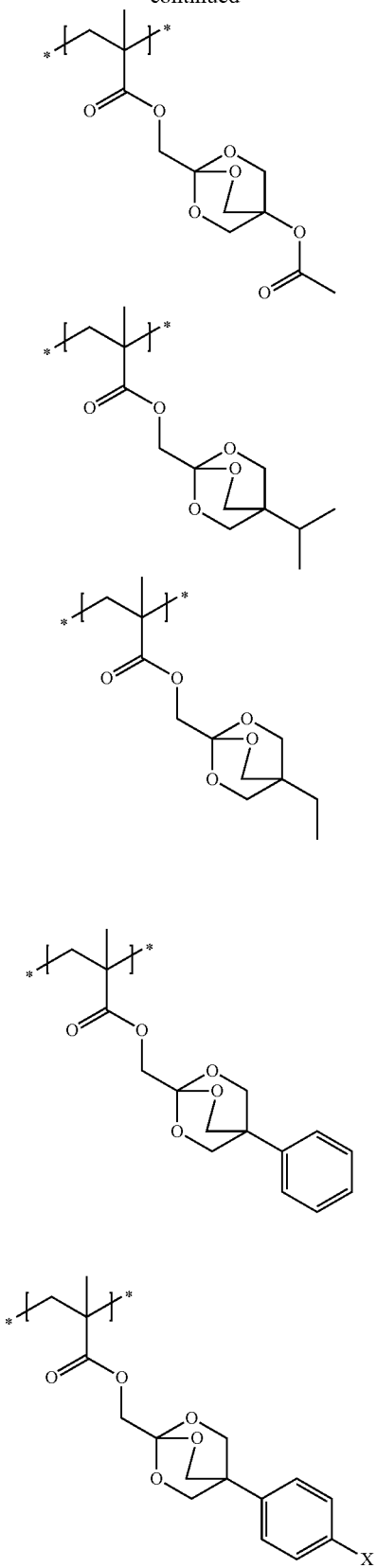

The first repeating unit may be generated by polymerizing a monomer of Chemical Formula 1-1.

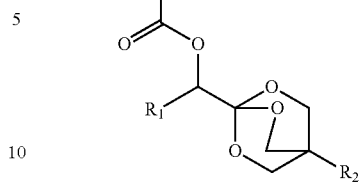

<Chemical Formula 1-1>

The monomer of Chemical Formula 1-1 may be, for example, an acrylic ester derivative synthesized according to a reaction scheme of Synthesis Example 1, but the inventive concept is not limited thereto.

Synthesis Example 1

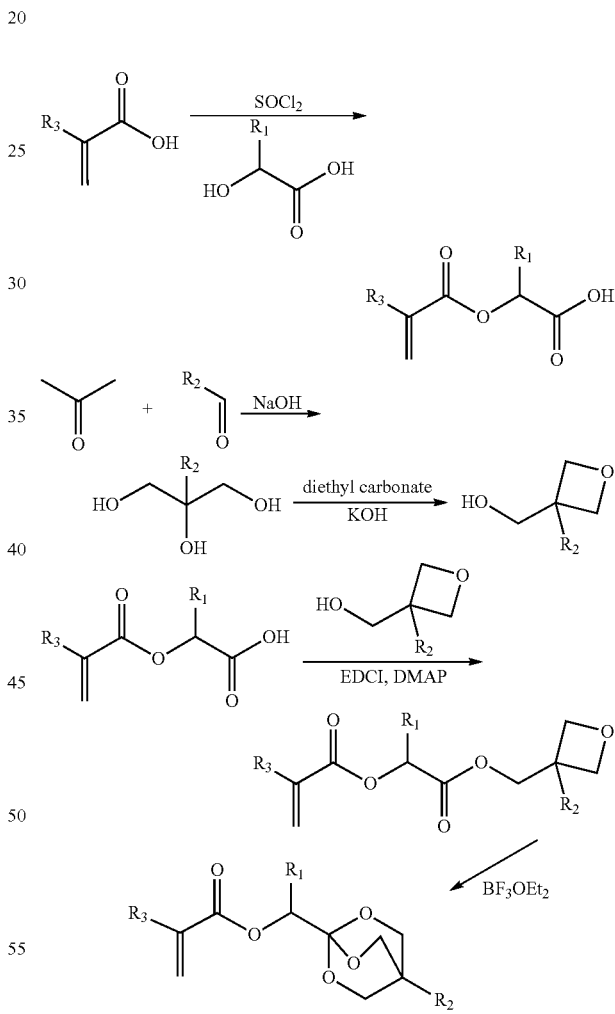

In some embodiments, the monomer of Chemical Formula 1-1 may be synthesized with reference to documents such as Barnes, R. A., et al., Bicyclic Ortho Esters by Direct Esterification, *J. Org. Chem.*, 1962, 27, pp. 90-93, Han, X., and P. E. Floreancig, Synthesis of Bridged Inside Outside Bicyclic Ethers through Oxidative Transannular Cyclization Reactions, *Org. Lett.*, 2012, 14, pp. 3808-3811, Norimura, Y., et al., Synthesis of sialic acid derivatives based on chiral substrate-controlled stereoselective aldol reactions using pyruvic acid oxabicyclo[2.2.2]octyl orthoester, *Org. Biomol. Chem.*, 2017, 15, pp. 640-648, and the like. Hereinafter, a moiety of Chemical Formula 1-2, which is bonded to an ester group in the first repeating unit and includes an ortho-ester group, is referred to as a "solubility adjusting moiety".

<Chemical Formula 1-2>

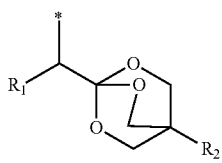

The solubility adjusting moiety may be converted into a moiety including a diol group as represented in Chemical Formula 5 or a moiety including a carboxyl group as represented in in Chemical Formula 6 by reacting with an acid when exposed to the acid. The acid may be an acid generated by the PAG in an exposure operation, as described below.

<Chemical Formula 5>

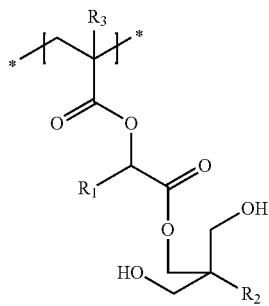

<Chemical Formula 6>

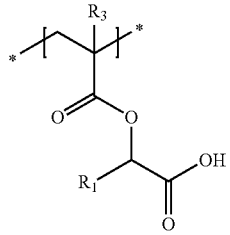

In some embodiments, repeating units of Chemical Formulae 5 and 6 may each be derived by reacting the first repeating unit with an acid according to Reaction Formula 1. However, the inventive concept is not limited thereto.

<Reaction Formula 1>

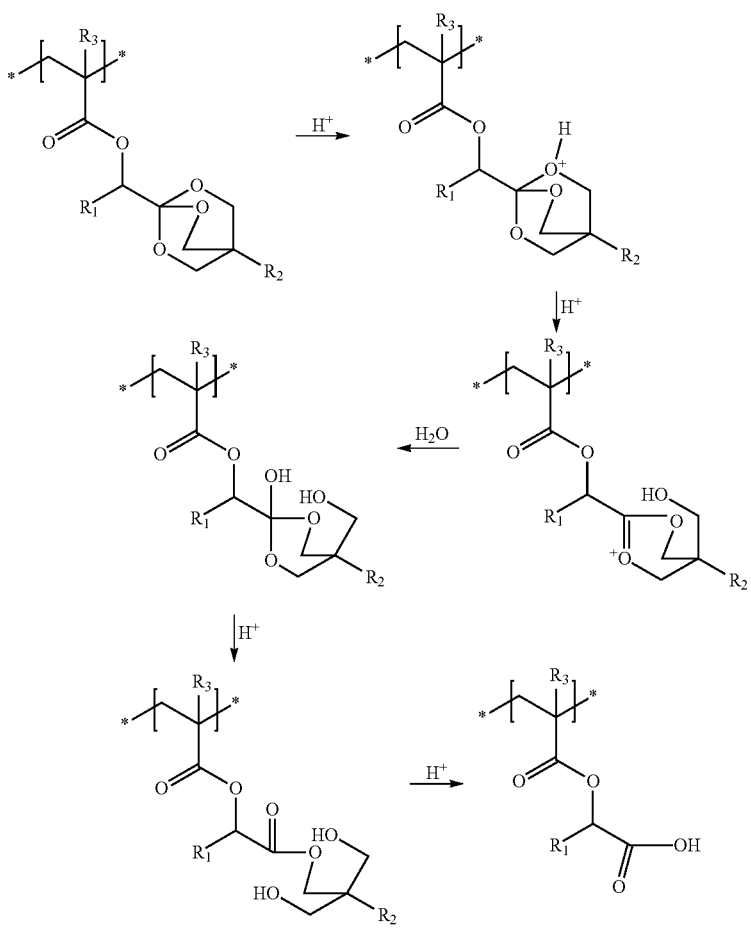

As shown in Reaction Formula 1, the first repeating unit may be converted into a repeating unit including a diol group or a carboxyl group by an acid. Such a repeating unit including a diol group or a carboxyl group may inhibit the dissolution of the photosensitive polymer in a developer such as n-butyl acetate.

According to the related art, sterically hindered functional groups including lactone have been used to control the solubility of the photosensitive polymer. The sterically hindered functional groups according to the related art have lower solubilities, before exposure, than a protecting group and a sensitizer, which are described below, and thus, have been able to control dissolution rates. After exposure, the sterically hindered functional groups according to the related art have not had solubility adjusting functions due to high solubilities in developers, as compared with carboxylic acids generated by dealkylation.

In contrast, in the case of the first repeating unit of the inventive concept, because a diol group and/or a carboxyl group remains in the same repeating unit even after exposure, the first repeating unit of the inventive concept may control a dissolution rate. In particular, it may be beneficial to further inhibit a dissolution rate of an exposed region in negative tone development, and in this regard, the first repeating unit may contribute to increasing a remaining thickness of a photoresist material film after an exposure process and a development process are performed. As used herein the term "and/or" includes any and all combinations of one or more of the associated listed items.

(Acrylic Resin)

The photosensitive polymer may further include a second repeating unit of an acrylic resin represented by Chemical Formula 2. In particular, the photosensitive polymer may include the second repeating unit including an acid-labile protecting group.

<Chemical Formula 2>

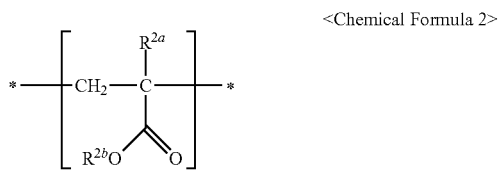

wherein $R^{2a}$ may be a hydrogen atom, a linear or branched alkyl group having 1 to 6 carbon atoms, a halogen atom, or a linear or branched alkyl halide group having 1 to 6 carbon atoms, and $R^{2b}$ is an acid-labile protecting group and may be, for example, a linear, branched, or cyclic alkyl group having 1 to 6 carbon atoms, a vinyloxyethyl group, a tetrahydropyranyl group, a tetrafuranyl group, a trialkylsilyl group, an isonorbornyl group, a 2-methyl-2-adamantyl group, a 2-ethyl adamantyl group, a 3-tetrahydrofuranyl group, a 3-oxocyclohexyl group, a γ-butyllactone-3-yl group, mavaloniclactone, a γ-butyrolactone-2-yl group, a 3-methyl-γ-butyrolactone-3-yl group, a 2-tetrahydropyranyl group, a 2-tetrahydrofuranyl group, a 2,3-propylenecarbonate-1-yl group, a 1-methoxyethyl group, a 1-ethoxyethyl group, a 1-(2-methoxyethoxy)ethyl group, a 1-(2-acetoxyethoxy)ethyl group, a t-buthoxycarbonylmethyl group, a methoxymethyl group, an ethoxymethyl group, a trimethoxysilyl group, a triethoxysilyl group, a methoxyethyl group, an ethoxyethyl group, an n-propoxyethyl group, an iso-propoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methylethyl group, a 1-ethoxy-1-methylethyl group, a tert-butoxycarbonyl (t-BOC) group, or a tert-butoxycarbonylmethyl group. The linear or branched alkyl group may include a methyl group, an ethyl group, a propyl group, an isopropyl group, an n-butyl group, an isobutyl group, a tert-butyl group, a pentyl group, an isopentyl group, a neopentyl group, or the like. In addition, the cyclic alkyl group may include a cyclopentyl group, a cyclohexyl group, or the like.

In some embodiments, the second repeating unit may include a repeating unit of a (meth)acrylate polymer. The (meth)acrylate polymer may be an aliphatic (meth)acrylate polymer and may include, for example, polymethylmethacrylate (PMMA), poly(t-butylmethacrylate), poly(methacrylic acid), poly(norbornylmethacrylate), a binary or ternary copolymer of repeating units of the (meth)acrylate polymers set forth above, or a combination thereof. In some embodiments, the second repeating unit may include a repeating unit formed from a (meth)acrylate (also referred to as a "(meth)acrylate unit)." The (meth)acrylate unit may be an aliphatic (meth)acrylate unit and may include, for example, repeating units formed from methylmethacrylate, t-butylmethacrylate, methacrylic acid, norbornylmethacrylate, or a combination of two, three, or more of the (meth)acrylate units set forth above.

In some embodiments, the acrylic resin may further include another polymerizable compound as a repeating unit. Such a polymerizable compound may include, for example, ether linkage-containing acrylates such as 2-methoxyethyl (meth)acrylate, 2-ethoxyethyl(meth)acrylate, methoxytriethylene glycol (meth)acrylate, 3-methoxybutyl (meth)acrylate, ethyl carbitol (meth)acrylate, phenoxy polyethylene glycol (meth)acrylate, methoxy polyethylene glycol (meth)acrylate, methoxy polypropylene glycol (meth)acrylate, and tetrahydrofurfuryl (meth)acrylate, monocarboxylic acids such as acrylic acid, methacrylic acid, and crotonic acid, dicarboxylic acids such as maleic acid, fumaric acid, and itaconic acid, methacrylic acid derivatives having ester bonds and carboxyl groups such as 2-methacryloyloxyethyl succinate, 2-methacryloyloxy ethyl maleate, 2-methacryloyloxyethyl phthalate, and 2-methacryloyloxyethyl hexahydrophthalate, (meth)acrylic acid alkyl esters such as methyl (meth)acrylate, ethyl (meth)acrylate, butyl (meth)acrylate, and cyclohexyl (meth)acrylate, (meth)acrylic acid hydroxyalkyl esters such as 2-hydroxyethyl (meth)acrylate and 2-hydroxypropyl (meth)acrylate, (meth)acrylic acid aryl esters such as phenyl (meth)acrylate and benzyl (meth)acrylate, dicarboxylic acid diesters such as diethyl maleate and dibutyl fumarate, vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene, vinyl group-containing aliphatic compounds such as vinyl acetate, conjugated diolefins such as butadiene and isoprene, nitrile group-containing polymerizable compounds such as acrylonitrile and methacrylonitrile, chlorine-containing polymerizable compounds such as vinyl chloride and vinylidene chloride, amide bond-containing polymerizable compounds such as acrylamide and methacrylamide, and the like. However, the inventive concept is not limited thereto.

(Sensitizer)

The photosensitive polymer may include a sensitizing unit including a polyhydroxystyrene (PHS)-based third repeating unit represented by Chemical Formula 3.

<Chemical Formula 3>

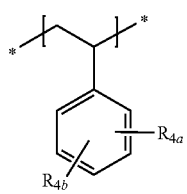

wherein $R_{4a}$ is hydrogen, a hydroxyl group, a carboxyl group, an alkyl group having 1 to 10 carbon atoms, a cycloalkyl group having 3 to 12 carbon atoms, or an alkoxy group having 1 to 10 carbon atoms, and $R_{4b}$ is a hydroxyl group or a carboxyl group.

In some embodiments, the third repeating unit may include one or more of moieties listed in Chemical Formulae 3-1.

<Chemical Formulae 3-1>

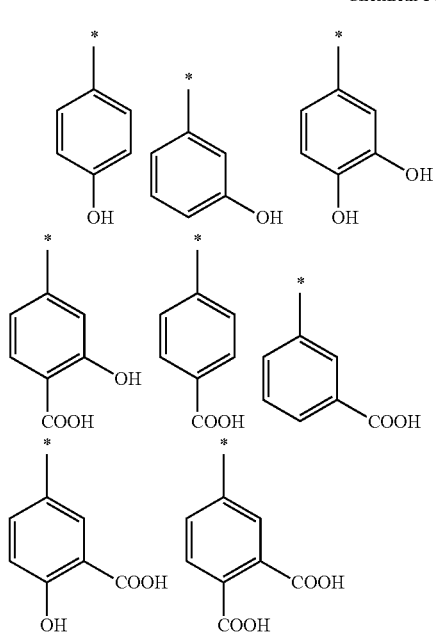

The first to third repeating units described above may be polymerized in a block copolymer form or a random copolymer form.

In some embodiments, the number of first repeating units may be about 5% to about 30% of the number of total repeating units. In some embodiments, a ratio of the first repeating units to the total repeating units may be in a range of about 5% to about 28%, about 5% to about 25%, about 5% to about 23%, about 5% to about 20%, about 5% to about 18%, or about 5% to about 15%, or in any range between these numerical values.

When the fraction of the first repeating units is too low, the effect of solubility adjustment according to the inventive concept may be insufficient. On the other hand, when the fraction of the first repeating units is too high, the sensitivity and contrast of the photosensitive polymer may be deteriorated.

The number of second repeating units may be about 35% to about 65% of the number of total repeating units. In some embodiments, a ratio of the second repeating units to the total repeating units may be in a range of about 37% to about 63%, about 39% to about 61%, about 41% to about 59%, about 43% to about 57%, about 45% to about 55%, or about 47% to about 53%, or in any range between these numerical values.

When the fraction of the second repeating units is too low, the contrast of the photosensitive polymer may be deteriorated. When the fraction of the second repeating units is too high, the sensitivity of the photosensitive polymer may be deteriorated, or the solubility adjustment may be difficult.

The number of third repeating units may be about 20% to about 40% of the number of total repeating units. In some embodiments, a ratio of the third repeating units to the total repeating units may be in a range of about 22% to about 38%, about 24% to about 36%, about 25% to about 35%, about 26% to about 34%, about 27% to about 33%, or about 28% to about 32%, or in any range between these numerical values.

When the fraction of the third repeating units is too low, the sensitivity of the photosensitive polymer may be deteriorated. When the fraction of the third repeating units is too high, the contrast of the photosensitive polymer may be deteriorated, or the solubility adjustment may be difficult.

In some embodiments, the photosensitive polymer may further include an auxiliary unit including a fourth repeating unit represented by Chemical Formula 4.

<Chemical Formula 4>

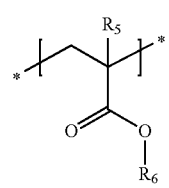

wherein $R_5$ may be hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms, and $R_6$ may be a linear, branched, and/or cyclic saturated or unsaturated hydrocarbon group having 1 to 20 carbon atoms and including 1 to 5 heteroatoms or no heteroatom. In some embodiments, $R_6$ may be a linear, branched, and/or cyclic saturated or unsaturated hydrocarbon group having 1 to 5 carbon atoms and including 1 to 5 oxygen atoms, nitrogen atoms, and/or halogen atoms or none thereof.

In some embodiments, $R_6$ in the fourth repeating unit may be one of moieties listed in Chemical Formulae 4-1.

<Chemical Formulae 4-1>

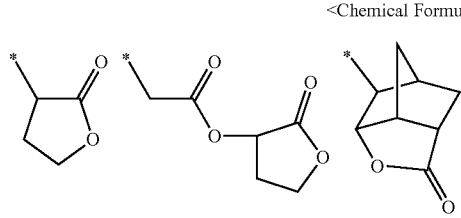

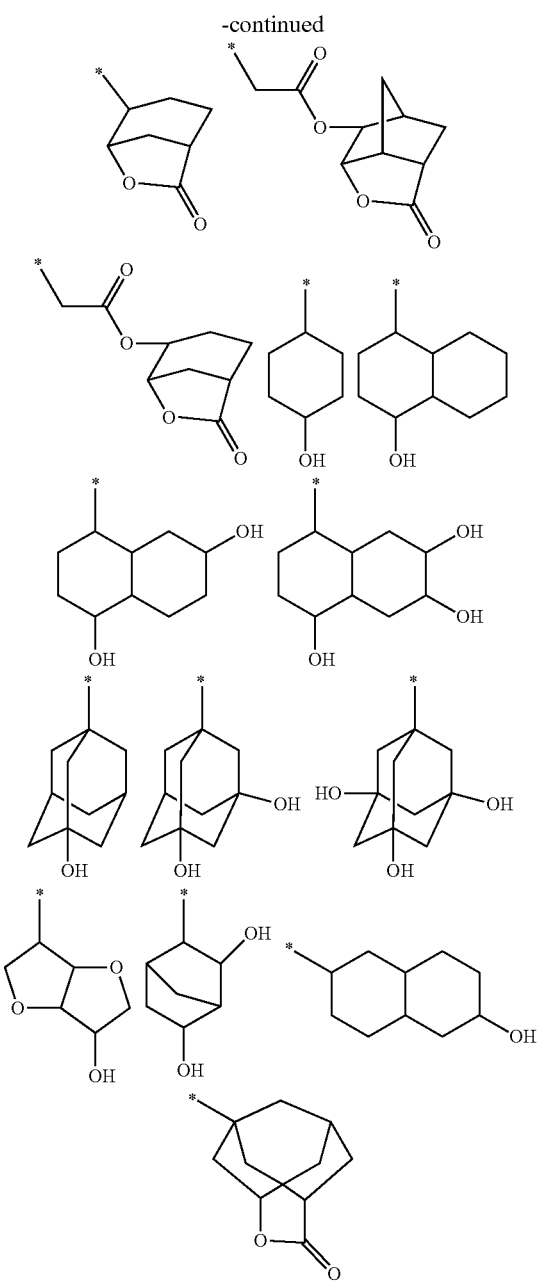

The auxiliary unit of the fourth repeating unit may be provided to, in company with the first repeating unit, additionally adjust the solubility of the photosensitive polymer, and may not be a necessary in some embodiments.

In some embodiments, the number of fourth repeating units may be about 3% to about 20% of the number of total repeating units. In some embodiments, a ratio of the fourth repeating units to the total repeating units may be in a range of about 3% to about 18%, about 4% to about 16%, about 5% to about 14%, about 6% to about 12%, or about 7% to about 10%, or in any range between these numerical values.

In some embodiments, a sum of the number of first repeating units and the number of fourth repeating units may be about 10% to about 40% of the number of total repeating units. In some embodiments, a ratio of the first and fourth repeating units to the total repeating units may be in a range of about 12% to about 38%, about 14% to about 36%, about 16% to about 34%, about 18% to about 32%, about 20% to about 30%, about 10% to about 42%, about 10% to about 44%, about 10% to about 46%, about 10% to about 48%, or about 10% to about 50%, or in any range between these numerical values.

When the fraction of the first and fourth repeating units is too low, an effect of adjusting the solubility of the photosensitive polymer may be insufficient. In addition, when the fraction of the first and fourth repeating units is too high, the sensitivity and contrast of the photosensitive polymer may be deteriorated.

In some embodiments, the photosensitive polymer may have a weight average molecular weight (Mw) of about 10,000 to 600,000. In some embodiments, the photosensitive polymer may have an Mw of about 20,000 to about 400,000 or about 30,000 to about 300,000. In some embodiments, the Mw may be a value measured by gel permeation chromatography (GPC) by taking polystyrene as a standard.

The photosensitive polymer may have a polydispersity index (PI) of about 1 to about 3. The photosensitive polymer may be present in an amount of about 5% by weight to about 60 by weight, based on a total weight of the photoresist composition.

Photoacid Generator (PAG)

In example embodiments, the photoresist composition according to some embodiments of the inventive concept may further include a PAG, which generates an acid upon exposure to radiation or light.

The PAG may include a material having a chemical structural formula that is different from that of the photodecomposable compound. For example, the PAG may generate an acid when exposed to light of one selected from a KrF excimer laser (248 nm), an ArF excimer laser (193 nm), an F2 excimer laser (157 nm), and an EUV laser (13.5 nm).

The PAG may include a material generating a relatively strong acid having an acid dissociation constant (pKa) that is equal to or greater than about −20 and less than about 1. The PAG may include, for example, triarylsulfonium salts, diaryliodonium salts, sulfonates, or a mixture thereof. For example, the PAG may include triphenylsulfonium triflate, triphenylsulfonium antimonate, triphenylsulfonium difluoroalkyl sulfonate, diphenyliodonium triflate, diphenyliodonium antimonate, methoxydiphenyliodonium triflate, di-t-butyl diphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or a mixture thereof.

In the photoresist composition according to some embodiments of the inventive concept, the PAG may be present in an amount of about 0.1 wt % to about 5.0 wt %, based on a total weight of the chemically amplified polymer, but the inventive concept is not limited thereto.

Solvent

In some embodiments, the solvent included in the photoresist composition may include an organic solvent. The organic solvent may include, but is not limited to, at least one of ethers, alcohols, glycol ethers, aromatic hydrocarbons, ketones, and esters. For example, the organic solvent may include ethylene glycol monomethyl ether, ethylene glycol monoethyl ether, methyl cellosolve acetate, ethyl cellosolve acetate, diethylene glycol methyl ether, diethylene glycol ethyl ether, propylene glycol, propylene glycol methyl ether (PGME), propylene glycol methyl ether acetate (PGMEA), propylene glycol ethyl ether, propylene glycol methyl ether acetate, propylene glycol propyl ether acetate, propylene glycol butyl ether, propylene glycol butyl ether acetate, ethanol, propanol, isopropyl alcohol, isobutyl alcohol, 4-methyl-2-pentanol (methyl isobutyl carbinol: MIBC), hexanol, 1-methoxy-2-propanol, 1-ethoxy-2-propanol, ethylene glycol, propylene glycol, heptanone, propylene carbonate, butylene carbonate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, gamma-butyrolactone, methyl 2-hydroxyisobutyrate, methoxybenzene, n-butyl acetate, 1-methoxy-2-propyl acetate, methoxyethoxy propionate, ethoxyethoxy propionate, or a combination thereof.

In the photoresist composition according to some embodiments of the inventive concept, the solvent may be present in a remaining amount excluding the amounts of main components including a radical quencher, etc. In example embodiments, the solvent may be present in an amount of about 0.1 wt % to about 99.7 wt %, based on the total weight of the photoresist composition.

Quencher

The photoresist composition according to some embodiments of the inventive concept may further include a basic quencher.

The basic quencher may trap an acid in a non-exposed region of a photoresist film, when the acid generated from the PAG included in the photoresist composition according to some embodiments of the inventive concept diffuse into the non-exposed region. The basic quencher is included in the photoresist composition according to some embodiments of the inventive concept, and thus, after a photoresist film obtained from the photoresist composition is exposed, issues occurring because an acid generated in an exposed region of the photoresist film diffuse into a non-exposed region of the photoresist film may be reduced/prevented.

In example embodiments, the basic quencher may include primary aliphatic amines, secondary aliphatic amines, tertiary aliphatic amines, aromatic amines, heterocyclic ring-containing amines, nitrogen-containing compounds having carboxyl groups, nitrogen-containing compounds having sulfonyl groups, nitrogen-containing compounds having hydroxyl groups, nitrogen-containing compounds having hydroxyphenyl groups, alcoholic nitrogen-containing compounds, amides, imides, carbamates, or ammonium salts. For example, the basic quencher may include, but is not limited to, triethanolamine, triethylamine, tributylamine, tripropylamine, hexamethyldisilazan, aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, or a combination thereof.

In some embodiments, the basic quencher may include a photo-decomposable base. The photo-decomposable base may include a compound generating an acid by exposure and neutralizing an acid before exposure. The photo-decomposable base may lose a function of trapping an acid when decomposed by exposure. Accordingly, when a certain region of a photoresist film formed of a chemically amplified photoresist composition, which includes the basic quencher including the photo-decomposable base, is exposed, the photo-decomposable base in the exposed region of the photoresist film loses alkalinity, and the photo-decomposable base in a non-exposed region of the photoresist film traps an acid, thereby reducing or preventing issues occurring because an acid generated in the exposed region of the photoresist film diffuse into the non-exposed region of the photoresist film.

The photo-decomposable base may include a carboxylate or sulfonate salt of a photo-decomposable cation. For example, the photo-decomposable cation may form a complex in company with an anion of a carboxylic acid having 1 to 20 carbon atoms. The carboxylic acid may include, but is not limited to, for example, formic acid, acetic acid, propionic acid, tartaric acid, succinic acid, cyclohexylcarboxylic acid, benzoic acid, or salicylic acid.

In the photoresist composition according to some embodiments of the inventive concept, the basic quencher may be present in an amount of about 0.01 wt % to about 5.0 wt %, based on the total weight of the photoresist composition, but the inventive concept is not limited thereto.

Other Components

In example embodiments, the photoresist composition according to some embodiments of the inventive concept may further include a surfactant, a dispersant, a moisture absorbent, and/or a coupling agent.

The surfactant may improve the coating uniformity and wettability of the photoresist composition. In example embodiments, the surfactant may include, but is not limited to, a sulfuric acid ester salt, a sulfonic acid salt, phosphoric acid ester, soap, an amine salt, a quaternary ammonium salt, polyethylene glycol, an alkylphenol ethylene oxide adduct, a polyhydric alcohol, a nitrogen-containing vinyl polymer, or a combination thereof. For example, the surfactant may include an alkylbenzene sulfonate, an alkyl pyridinium salt, polyethylene glycol, or a quaternary ammonium salt. When the photoresist composition includes the surfactant, the surfactant may be present in an amount of about 0.001 wt % to about 3 wt %, based on the total weight of the photoresist composition.

The dispersant may allow the respective components constituting the photoresist composition to be uniformly dispersed in the photoresist composition. In example embodiments, the dispersant may include, but is not limited to, an epoxy resin, polyvinyl alcohol, polyvinyl butyral, polyvinylpyrrolidone, glucose, sodium dodecyl sulfate, sodium citrate, oleic acid, linoleic acid, or a combination thereof. When the photoresist composition includes the dispersant, the dispersant may be present in an amount of about 0.001 wt % to about 5 wt %, based on the total weight of the photoresist composition.

The moisture absorbent may reduce or prevent adverse effects due to moisture in the photoresist composition. For example, the moisture absorbent may reduce or prevent oxidation of a metal included in the photoresist composition by moisture. In example embodiments, the moisture absorbent may include, but is not limited to, polyoxyethylene nonylphenol ether, polyethylene glycol, polypropylene glycol, polyacrylamide, or a combination thereof. When the photoresist composition includes the moisture absorbent, the moisture absorbent may be present in an amount of about 0.001 wt % to about 10 wt %, based on the total weight of the photoresist composition.

The coupling agent may improve adhesion to a lower film when the photoresist composition is coated on the lower film. In example embodiments, the coupling agent may include a silane coupling agent. The silane coupling agent may include, but is not limited to, vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyldiethoxysilane, or trimethoxy[3-(phenylamino)propyl]silane. When the photoresist composition includes the coupling agent, the coupling agent may be present in an amount of about 0.001 wt % to about 5 wt %, based on the total weight of the photoresist composition.

In the photoresist composition according to some embodiments of the inventive concept, when the solvent includes only an organic solvent, the photoresist composition may further include water. In this case, water may be present in an amount of about 0.001 wt % to about 0.1 wt % in the photoresist composition.

Fabrication of Integrated Circuit Device

Next, a method of fabricating an integrated circuit device by using the photoresist composition according to some embodiments of the inventive concept will be described by taking specific examples.

FIG. 1 is a flowchart illustrating a method of fabricating an integrated circuit device, according to some embodiments of the inventive concept. FIGS. 2A to 2E are cross-sectional views illustrating a method of fabricating an integrated circuit device, according to some embodiments of the inventive concept.

Figure 2A:
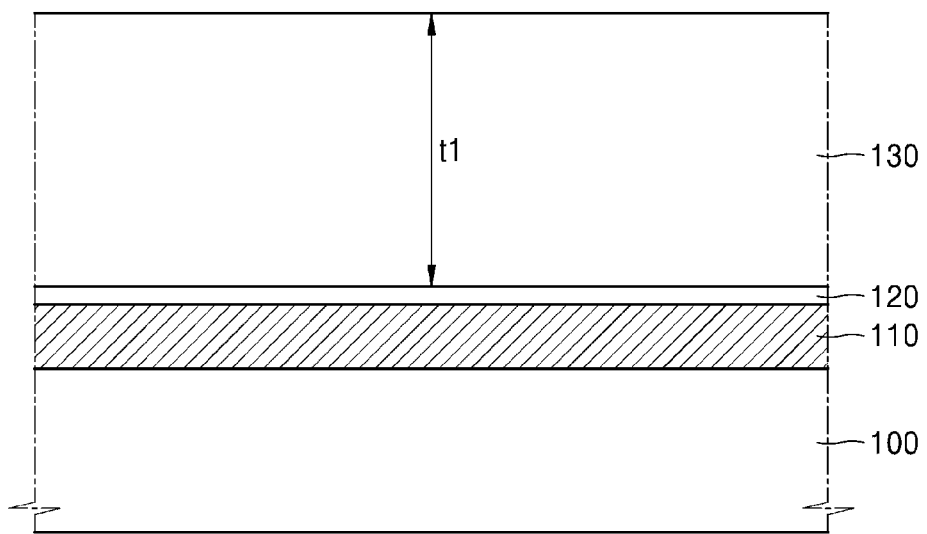
FIGS. 2A to 2E are cross-sectional views illustrating a method of fabricating an integrated circuit device, according to some embodiments of the inventive concept.

Referring to FIGS. 1 and 2A, in a process P10, a feature layer 110 is formed on a substrate 100, and in a process P20, a photoresist film 130 is formed to a first thickness t1 on the feature layer 110 by using the photoresist composition according to the inventive concept. In some embodiments, the first thickness t1 of the photoresist film 130 may be tens to hundreds of nm.

The photoresist film 130 may include the photoresist composition according to some embodiments of the inventive concept. A more detailed configuration of the photoresist composition is the same as described above.

The substrate 100 may include a semiconductor substrate. The feature layer 110 may include an insulating film, a conductive film, and/or a semiconductor film. For example, the feature layer 110 may include, but is not limited to, a metal, an alloy, a metal carbide, a metal nitride, a metal oxynitride, a metal oxycarbide, a semiconductor, polysilicon, an oxide, a nitride, an oxynitride, or a combination thereof.

In example embodiments, as shown in FIG. 2A, before the photoresist film 130 is formed on the feature layer 110, a lower film 120 may be formed on the feature layer 110. In this case, the photoresist film 130 may be formed on the lower film 120. The lower film 120 may prevent the photoresist film 130 from being adversely affected by the feature layer 110 under the photoresist film 130. In example embodiments, the lower film 120 may include an organic or inorganic anti-reflective coating (ARC) material for KrF excimer lasers, ArF excimer lasers, EUV lasers, or any other light sources. In example embodiments, the lower film 120 may include a bottom anti-reflective coating (BARC) film and/or a developable bottom anti-reflective coating (DBARC) film. In some embodiments, the lower film 120 may include an organic component having a light absorption structure. The light absorption structure may include, for example, a hydrocarbon compound having a structure in which one or more benzene rings are fused. The lower film 120 may have, but is not limited to, a thickness of about 1 nm to about 100 nm. In example embodiments, the lower film 120 may be omitted.

To form the photoresist film 130, the photoresist composition according to some embodiments of the inventive concept may be coated on the lower film 120. The coating may be performed by a method such as spin coating, spray coating, dip coating, or the like. The thickness of the photoresist film 130 may be tens to hundreds of times the thickness of the lower film 120. The photoresist film 130 may have, but is not limited to, a thickness of about 10 nm to about 1 μm.

In a process P30, a first bake process may be performed on the photoresist film 130. The first bake process may be referred to as post-apply bake (PAB).

The first bake process may be performed at a temperature of about 80° C. to about 140° C. or about 90° C. to about 120° C. for about 10 seconds to about 100 seconds. When the temperature of the first bake process is too low, the removal of the solvent may be insufficient. When the temperature of the first bake is too high, a resolution of a photoresist pattern may be deteriorated.

Figure 2B:
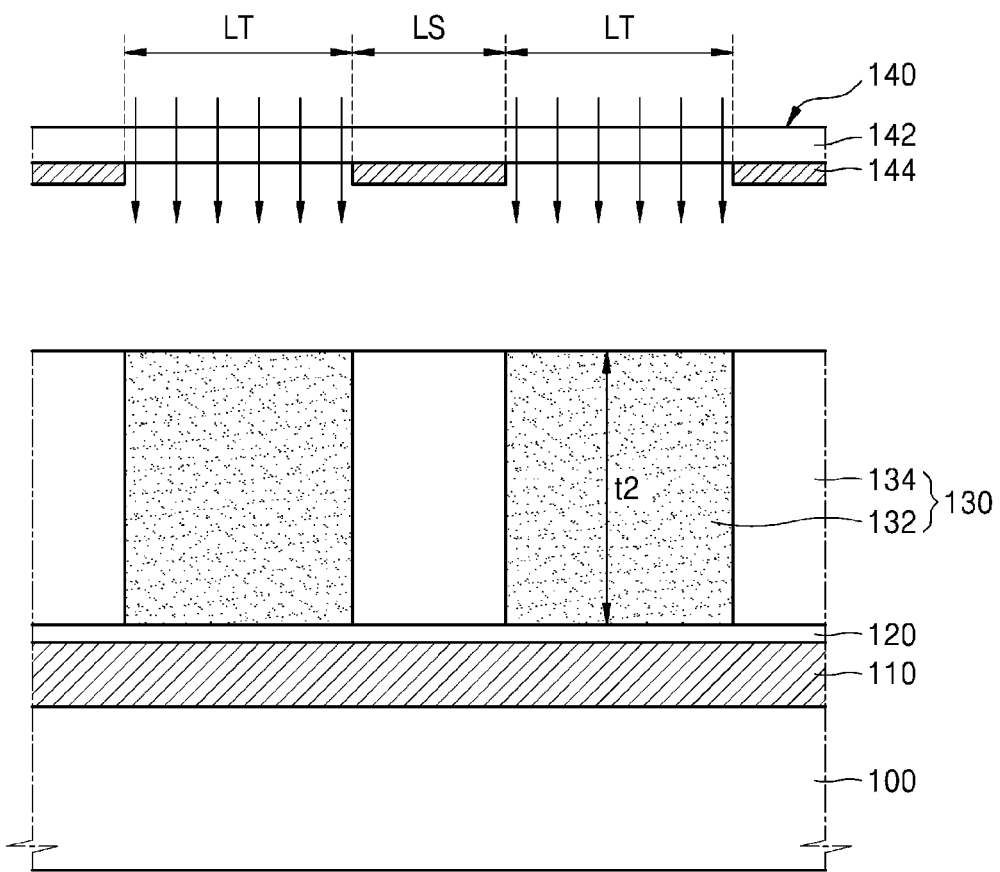

Referring to FIGS. 1 and 2B, in a process P40, a first region 132, which is a portion of the photoresist film 130, is exposed, thereby generating an acid from the PAG in the photoresist composition in the first region 132.

In example embodiments, to expose the first region 132 of the photoresist film 130, a photomask 140, which has a plurality of light shielding areas LS and a plurality of light transmitting areas LT, may be aligned at a certain position over the photoresist film 130, and the first region 132 of the photoresist film 130 may be exposed through the plurality of light transmitting areas LT of the photomask 140. To expose the first region 132 of the photoresist film 130, a KrF excimer laser (248 nm), an ArF excimer laser (193 nm), an F2 excimer laser (157 nm), or an EUV laser (13.5 nm) may be used. In some embodiments, a reflective photomask may be used instead of a transmissive photomask, according to the type of light source. Although descriptions made hereinafter put emphasis on a transmissive photomask, it will be understood by those of ordinary skill in the art that the exposure may also be performed by an equivalent configuration by using a reflective photomask.

The photomask 140 may include a transparent substrate 142, and a plurality of light shielding patterns 144 formed in the plurality of light shielding areas LS on the transparent substrate 142. The transparent substrate 142 may include quartz. The plurality of light shielding patterns 144 may include chromium (Cr). The plurality of light transmitting areas LT may be defined by the plurality of light shielding patterns 144. According to some embodiments of the inventive concept, to expose the first region 132 of the photoresist film 130, a reflective photomask (not shown) for EUV exposure may be used instead of the photomask 140.

Figure 3A:
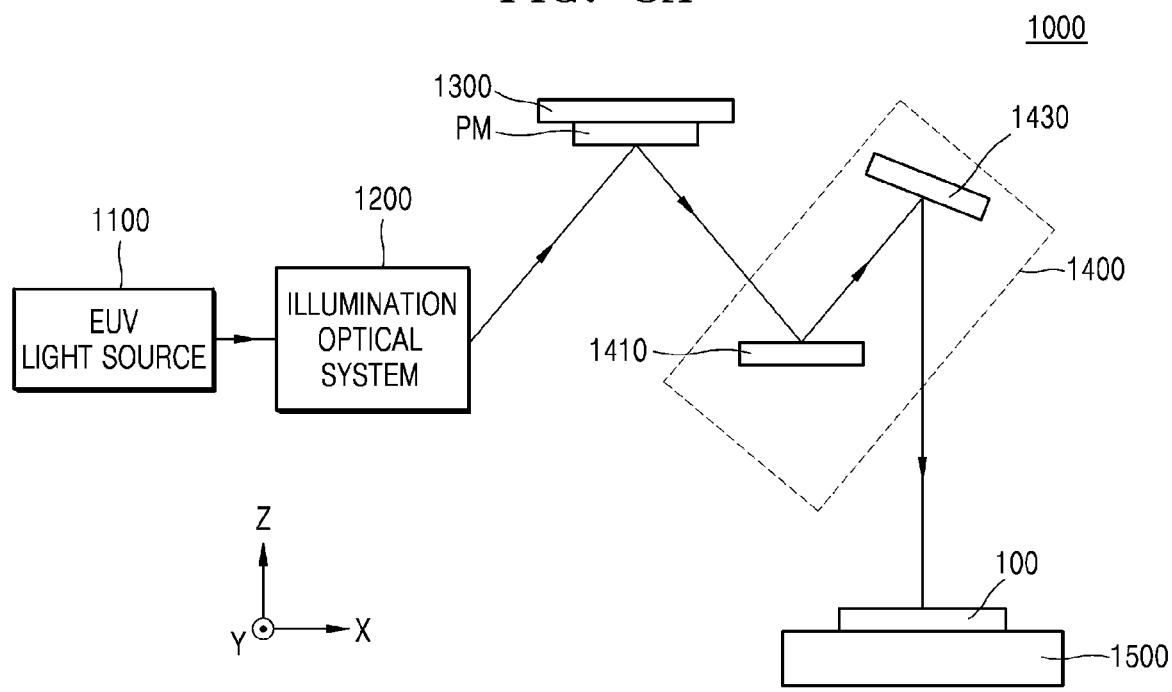
FIGS. 3A and 3B are schematic diagrams illustrating EUV exposure performed on a photoresist film on a feature layer.
Figure 3B:
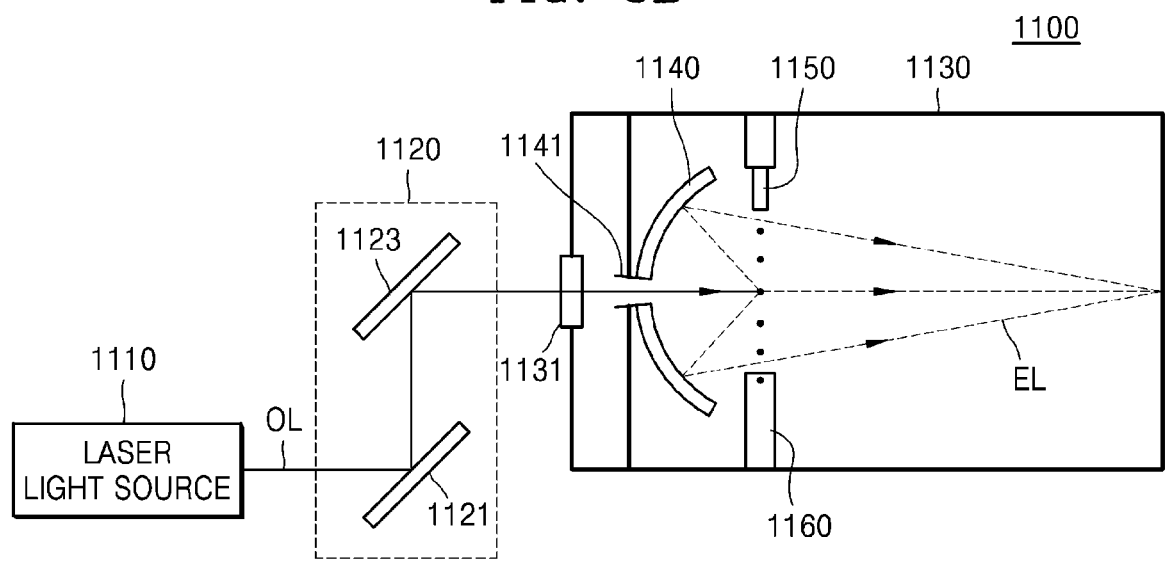

FIGS. 3A and 3B are schematic diagrams illustrating EUV exposure performed on the photoresist film 130 on the feature layer 110.

Referring together to FIGS. 3A and 3B, an EUV exposure device 1000 may include an EUV light source 1100, an illumination optical system 1200, a photomask support 1300, a projection optical system 1400, and a substrate stage 1500.

The EUV light source 1100 may generate and output EUV light EL having a high energy density. For example, the EUV light EL emitted from the EUV light source 1100 may have a wavelength of about 4 nm to about 124 nm. In some embodiments, the EUV light EL may have a wavelength of about 4 nm to about 20 nm, in particular, a wavelength of 13.5 nm.

The EUV light source 1100 may be a plasma-based light source or a synchrotron radiation light source. Here, the plasma-based light source refers to a light source in which plasma is generated and light emitted by the plasma is used, and may include a laser produced plasma light source, a discharge produced plasma light source, or the like.

The EUV light source 1100 may include a laser light source 1110, a transfer optical system 1120, a vacuum chamber 1130, a collector mirror 1140, a droplet generator 1150, and a droplet catcher 1160.

The laser light source 1110 may be configured to output a laser beam OL. For example, the laser light source 1110 may output a carbon dioxide laser beam. The laser beam OL output from the laser light source 1110 may be incident on a window 1131 of the vacuum chamber 1130 through a plurality of reflective mirrors 1121 and 1123 included in the transfer optical system 1120, and be introduced into the vacuum chamber 1130.

An aperture 1141, through which the laser beam OL may pass, is formed in a central region of the collector mirror 1140, and the laser beam OL may be introduced into the vacuum chamber 1130 through the aperture 1141 of the collector mirror 1140.

The droplet generator 1150 may generate a droplet generating the EUV light EL, by interacting with the laser beam OL, and may provide the droplet into the vacuum chamber 1130. The droplet may include at least one of tin (Sn), lithium (Li), and xenon (Xe). For example, the droplet may include at least one of tin (Sn), a tin compound (for example, $SnBr_4$, $SnBr_2$, or SnH), and a tin alloy (for example, Sn—Ga, Sn—In, or Sn—In—Ga).

The droplet catcher 1160 is located under the droplet generator 1150 and may be configured to collect droplets having not reacted with the laser beam OL. The droplets provided by the droplet generator 1150 may generate the EUV light EL by reacting with the laser beam OL introduced into the vacuum chamber 1130. The collector mirror 1140 may emit the EUV light EL to the illumination optical system 1200 arranged outside the vacuum chamber 1130, by collecting and reflecting the EUV light EL.

The illumination optical system 1200 may include a plurality of reflective mirrors and may transfer the EUV light EL, which is emitted from the EUV light source 1100, to an EUV photomask PM. For example, the EUV light EL emitted from the EUV light source 1100 may be reflected by a reflective mirror in the illumination optical system 1200 and be incident on the EUV photomask PM arranged on the photomask support 1300.

The EUV photomask PM may be a reflective mask including a reflective area and a non-reflective (or medium-reflective) area. The EUV photomask PM may include a reflective multilayer film, which is formed on a mask substrate formed of a material such as silicon (Si) having a low coefficient of thermal expansion, and an absorption pattern formed on the reflective multilayer film. Here, the reflective multilayer film may correspond to the reflective area, and the absorption pattern may correspond to the non-reflective (or medium-reflective) area.

The EUV photomask PM reflects the EUV light EL, which is incident through the illumination optical system 1200, and thus causes the EUV light EL to be incident on the projection optical system 1400. Specifically, the EUV photomask PM structuralizes light, which is incident from the illumination optical system 1200, into projection light, based on a pattern shape formed by the reflective multilayer film and the absorption pattern on the mask substrate, and causes the projection light to be incident on the projection optical system 1400. The projection light may be structuralized through a diffraction order of at least 2 due to the EUV photomask PM. The projection light may be incident on the projection optical system 1400 while having information about the pattern shape of the EUV photomask PM, and may form an image, which corresponds to the pattern shape of the EUV photomask PM, on a substrate 100 through the projection optical system 1400.

The projection optical system 1400 may include a plurality of reflective mirrors 1410 and 1430. Although two reflective mirrors 1410 and 1430 are shown in the projection optical system 1400 in FIG. 3A, this is for convenience of description, and the projection optical system 1400 may include more reflective mirrors than two. For example, the projection optical system 1400 may generally include 4 to 8 reflective mirrors. However, the number of reflective mirrors included in the projection optical system 1400 is not limited to the numerical values set forth above.

The substrate 100 may be arranged on the substrate stage 1500. The substrate stage 1500 may move in a first direction (X direction) and a second direction (Y direction) on an X-Y plane and may also move a third direction (Z direction) that is perpendicular to the X-Y plane. By the movement of the substrate stage 1500, the substrate 100 may also move in the first direction (X direction), the second direction (Y direction), and/or the third direction (Z direction) in the same manner.

After the first region 132 of the photoresist film 130 is exposed according to the process P40, the photoresist film 130 may undergo a second bake process in a process P50. The second bake process may be referred to as post-exposure bake (PEB). The second bake process may be performed at a temperature of about 50° C. to about 400° C. for about 10 seconds to about 100 seconds, but the inventive concept is not limited thereto. In example embodiments, during the second bake of the photoresist film 130, a degree of cross-linking between photosensitive polymer molecules in the first region 132 may be further increased. Accordingly, a difference in solubility in a developer between the exposed first region 132 and the non-exposed second region 134 of the photoresist film 130 may be further increased, and pattern collapse may be reduced or prevented.

In the exposure operation of the process P40 and the PEB operation of the process P50, the first repeating unit of the photosensitive polymer may be converted into a repeating unit including a diol group and/or a carboxyl group, as shown in Reaction Formula 1.

In addition, in the exposure operation of the process P40 and the PEB operation of the process P50, a separated protecting group, a reaction byproduct, and the like may outgas in a gaseous form and thus depart from the photoresist film 130. Accordingly, after the PEB operation of the process P50, the exposed first region 132 may have a second thickness t2, and the second thickness t2 may be less than the first thickness t1. That is, although upper surfaces of the first region 132 and the second region 134 are shown as being flat at the same level in FIG. 2B, the photoresist film 130 may actually have a slightly concave upper surface in the first region 132.

The repeating unit derived from the first repeating unit and containing a diol group and/or a carboxyl group may maintain a function of reducing the solubility in a developer even after the exposure, and thus, may contribute to further increasing the difference in solubility in the developer between the exposed first region 132 and the non-exposed second region 134. In other words, the remaining thickness of the photoresist film 130 in the exposed first region 132 even after development may be increased, and this will be described below in more detail.

Figure 2C:
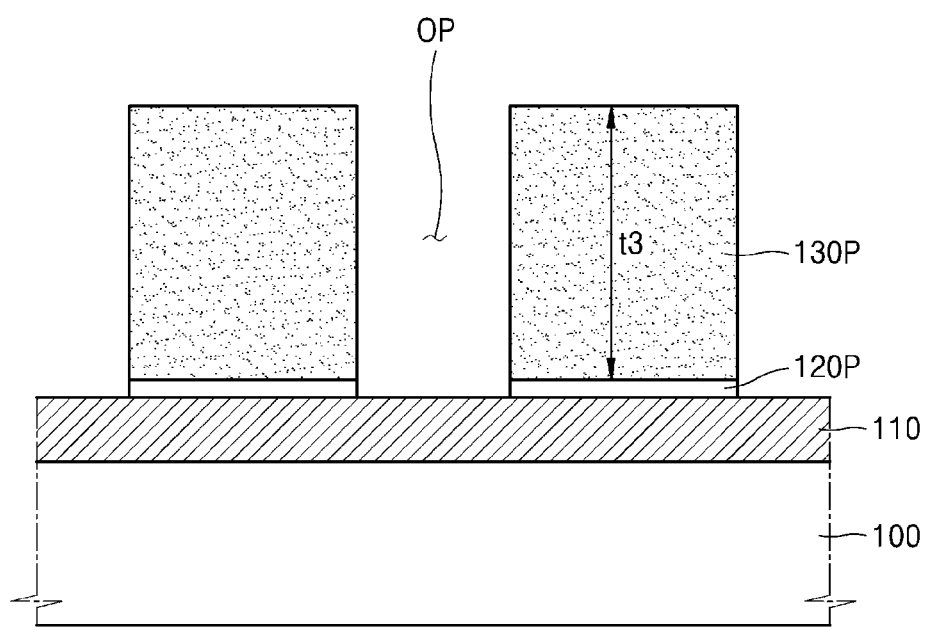

Referring to FIGS. 1 and 2C, in a process P60, the second region 134 of the photoresist film 130 is removed by developing the photoresist film 130 by using a developer. As a result, a photoresist pattern 130P including the exposed first region 132 of the photoresist film 130 may be formed.

In example embodiments, the development of the photoresist film 130 may be performed by a negative-tone development (NTD) process. For example, n-butyl acetate (nBA) or 2-heptanone may be used as the developer, but the developer is not limited thereto.

As described with reference to FIG. 2B, as the difference in solubility in the developer between the exposed first region 132 and the non-exposed second region 134 in the photoresist film 130 increases, the thickness of the photoresist film 130, which remains in the first region 132 without being removed while the second region 134 is removed by developing the photoresist film 130 in the process of FIG. 2C, increases.

Figure 4:
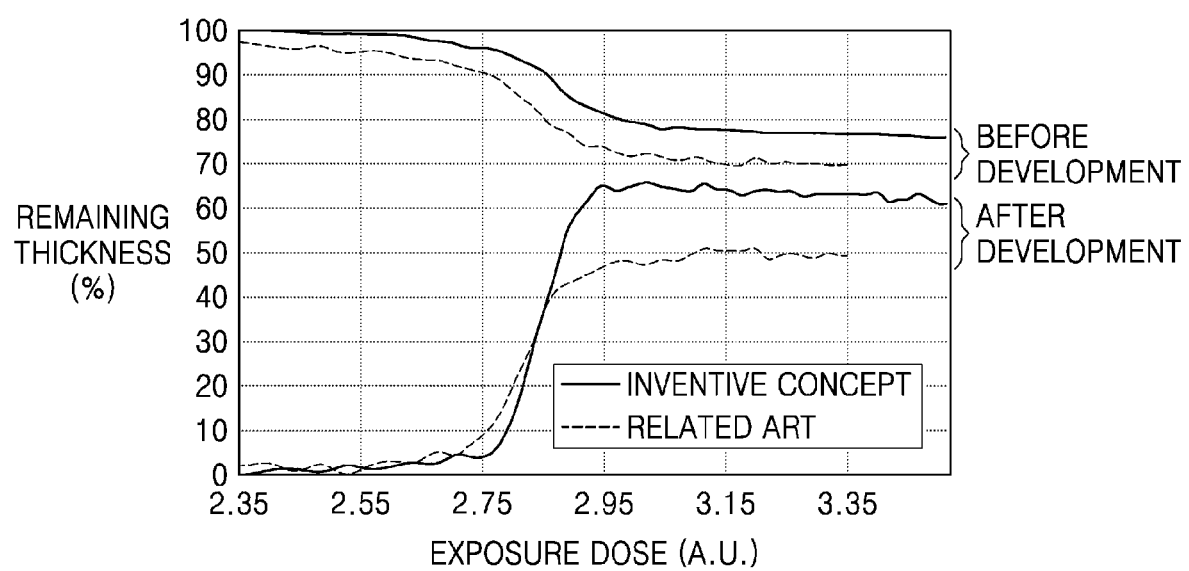
FIG. 4 is a graph depicting a remaining thickness of an exposed region after development as a function of an exposure dose when a photoresist composition according to some embodiments of the inventive concept and a photoresist composition according to the related art are used.

FIG. 4 is a graph depicting a remaining thickness of an exposed region after development as a function of an exposure dose when the photoresist composition according to the inventive concept and a photoresist composition according to the related art are used.

Referring to FIG. 4, when light is irradiated at an exposure dose that is less than a critical exposure dose (approximate 2.85 in FIG. 4), although a thickness of a photoresist film at the time of application is maintained before development, because almost the entire photoresist film is removed by NTD after the development, the thickness of the remaining photoresist film is almost 0.

When light is irradiated at an exposure dose that is greater than the critical exposure dose, it is the same as described with reference to FIG. 2B that the thickness (that is, the second thickness t2) of the photoresist film before the development after PEB is less than the thickness of the photoresist film at the time of application.

Referring together to FIGS. 2C and 4, when the irradiation by light at an exposure dose greater than the critical exposure dose is performed and NTD is subsequently performed, the remaining photoresist pattern 130P may have the third thickness t3, and the third thickness t3 is less than the second thickness t2. As shown in FIG. 4, the third thickness t3 is about 56% to about 65% of the thickness (that is, the first thickness t1) of the photoresist film 130 at the time of application.

When the photoresist composition of the inventive concept is used, a remaining thickness ratio (that is, a ratio of the third thickness t3 to the first thickness t1) may be secured as compared with a photoresist composition according to the related art.

Accordingly, after the photoresist film 130 is developed, residual defects such as footing may not be generated, and the profile contrast in the photoresist pattern 130P may be improved. As such, by improving the profile of the photoresist pattern 130P, when the feature layer 110 is processed by using the photoresist pattern 130P, a critical dimension of an intended processing region in the feature layer 110 may be precisely controlled.

The photoresist pattern 130P may include a plurality of openings OP. After the photoresist pattern 130P is formed, a lower pattern 120P may be formed by removing portions of the lower film 120, which are exposed by the plurality of openings OP.

Figure 2D:
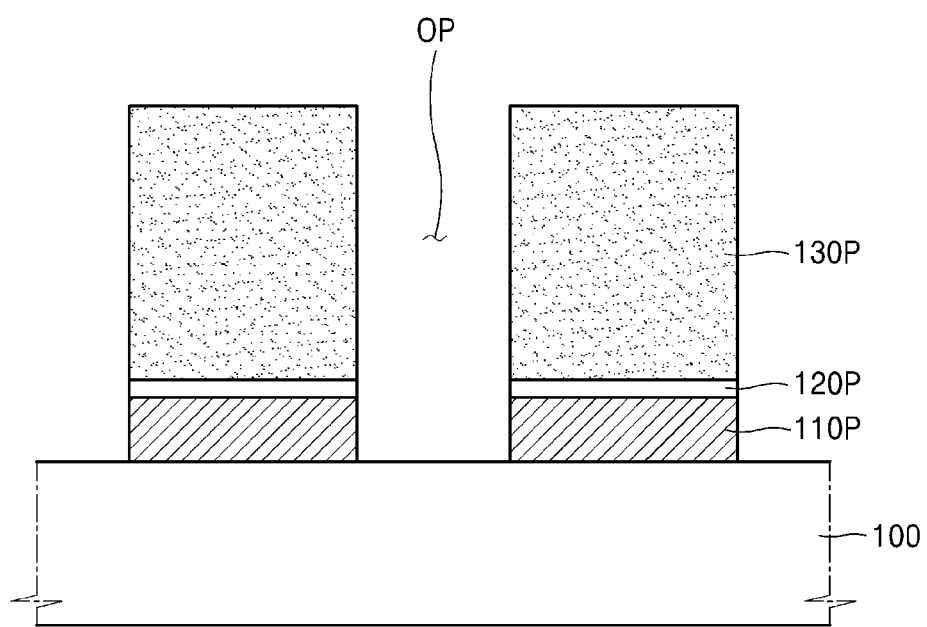

Referring to FIGS. 1 and 2D, in a process P70, the feature layer 110 is processed by using the photoresist pattern 130P in a resulting product of FIG. 2C.

To process the feature layer 110, various processes, such as a process of etching the feature layer 110 exposed by the openings OP of the photoresist pattern 130P, a process of implanting impurity ions into the feature layer 110, a process of forming an additional film on the feature layer 110 through the openings OP, and a process of modifying portions of the feature layer 110 through the openings OP, may be performed. FIG. 2D illustrates, as an example process of processing the feature layer 110, an example of forming a feature pattern 110P by etching the feature layer 110 exposed by the openings OP.

In some example embodiments, the process of forming the feature layer 110 may be omitted from the process described with reference to FIG. 2A, and in this case, instead of the process P70 of FIG. 1 and the process described with reference to FIG. 2D, the substrate 100 may be processed by using the photoresist pattern 130P. For example, various processes, such as a process of etching a portion of the substrate 100 by using the photoresist pattern 130P, a process of implanting impurity ions into some regions of the substrate 100, a process of forming an additional film on the substrate 100 through the openings OP, and a process of modifying portions of the substrate 100 through the openings OP, may be performed.

Figure 2E:
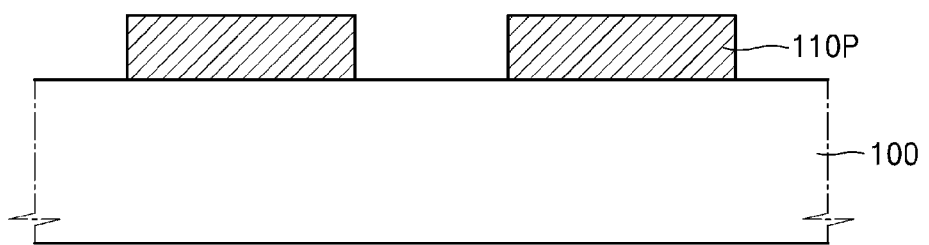

Referring to FIG. 2E, the photoresist pattern 130P and the lower pattern 120P, which remain on the feature pattern 110P, in a resulting product of FIG. 2D may be removed. To remove the photoresist pattern 130P and the lower pattern 120P, ashing and strip processes may be used.

In accordance with the method of fabricating an integrated circuit device, which is described with reference to FIGS. 1 and 2A to 2E, according to some embodiments of the inventive concept, because the first repeating unit allowing the solubility of the photoresist film to be adjusted even after exposure is included in the photosensitive polymer, a ratio of a remaining thickness after development may be increased, and this helps to obtain a better-quality pattern.

Hereinafter, although the inventive concept is described in more detail with reference to specific examples and comparison examples, these examples are provided only for clearer understanding of the inventive concept and are not to be construed in any way as limiting the scope of the inventive concept.

Each photosensitive polymer was manufactured such that respective fractions of the first to third repeating units were as listed in Table 1, and a weight-average molecular weight of each photosensitive polymer was measured.

In addition, a photoresist composition, which included 20 wt % of each photosensitive polymer, 3.0 wt % of triphenylsulfonium difluoroalkylsulfonate as a PAG, 3.0 wt % of triethylamine as a quencher, 2.0 wt % of polyethylene glycol as a surfactant, and 72 wt % of propylene glycol methyl ether (PGME) as a solvent, was prepared, and a photoresist film was formed on a substrate by using the photoresist composition and measured as to a thickness t1.

Next, exposure and development were performed such that the photoresist film had line-and-space patterns. For the development, nBA was used. After the development, a thickness t3 of a line pattern was measured, a ratio of t3/t1 (that is, a remaining thickness ratio) was calculated, and these were provided in Table 1 together with the previously measured weight-average molecular weight. In addition, a development rate Rmax was calculated, in units of angstroms per second, from a development time and a thickness removed by the development and also provided in Table 1.

TABLE 1

|  | First Repeating Unit | | Second Repeating Unit | Third Repeating Unit | Fourth Repeating Unit(1) | | Fourth Repeating Unit(2) | | Mw | Rmax | Remaining Thickness |
| --- | --- | --- | --- | --- | --- | --- | --- | --- | --- | --- | --- |
|  | TYPE | Amount | (° C.) | (D) | TYPE | Amount | TYPE | Amount | (×10³ g/mol) | (A/sec) | Ratio (%) |
| Example 1 | A-1 | 5 | 50 | 30 | B-1 | 15 | — | — | 10.0 | 110 | 65 |
| Example 2 | A-1 | 15 | 50 | 30 | B-2 | 5 | — | — | 10.0 | 135 | 70 |
| Example 3 | A-1 | 5 | 50 | 30 | B-1 | 15 | — | — | 10.0 | 105 | 65 |
| Example 4 | A-1 | 30 | 45 | 20 | B-1 | 5 | — | — | 10.4 | 151 | 72 |
| Example 5 | A-2 | 18 | 45 | 30 | B-1 | 8 | B-3 | 7 | 9.7 | 138 | 68 |
| Example 6 | A-2 | 15 | 50 | 30 | B-2 | 5 | — | — | 8.6 | 126 | 76 |
| Example 7 | A-2 | 20 | 35 | 20 | B-1 | 23 | B-3 | 2 | 9.2 | 81 | 71 |
| Example 8 | A-2 | 18 | 40 | 28 | B-1 | 26 | B-3 | 2 | 10.5 | 73 | 68 |
| Example 9 | A-3 | 15 | 50 | 30 | B-2 | 5 | — | — | 10.1 | 115 | 77 |
| Example 10 | A-3 | 5 | 50 | 30 | B-1 | 15 | — | — | 10.1 | 135 | 78 |
| Example 11 | A-3 | 30 | 45 | 20 | B-1 | 5 | — | — | 9.6 | 141 | 69 |
| Example 12 | A-1 | 3 | 47 | 30 | B-1 | 20 | — | — | 10.1 | 125 | 54 |
| Comparative Example 1 | — | — | 57 | 20 | B-1 | 9 | B-3 | 6 | 7.6 | 43 | 50 |
| Comparative Example 2 | — | — | 55 | 21 | B-1 | 22 | B-2 | 2 | 10.5 | 79 | 60 |
| Comparative Example 3 | — | — | 56 | 20 | B-1 | 22 | B-2 | 2 | 9.6 | 91 | 57 |
| Comparative Example 4 | — | — | 56 | 22 | B-1 | 18 | B-2 | 4 | 9.4 | 87 | 59 |
| Comparative Example 5 | — | — | 54 | 22 | B-1 | 22 | B-2 | 2 | 7.6 | 128 | 48 |
| Comparative Example 6 | — | — | 54 | 23 | B-1 | 18 | B-2 | 5 | 7.4 | 141.3 | 45 |
| Comparative Example 7 | — | — | 50 | 23 | B-4 | 23 | B-3 | 4 | 10.2 | 61 | 60 |
| Comparative Example 8 | — | — | 53 | 34 | B-1 | 11 | B-2 | 2 | 12.4 | 101 | 58 |
| Comparative Example 9 | — | — | 52 | 35 | B-1 | 11 | B-2 | 2 | 8.7 | 119 | 54 |
| Comparative Example 10 | — | — | 55 | 31 | B-1 | 12 | B-2 | 2 | 7.5 | 127 | 51 |
| Comparative Example 11 | — | — | 53 | 34 | B-1 | 9 | B-2 | 4 | 8.4 | 125 | 53 |
| Comparative Example 12 | — | — | 54 | 30 | B-1 | 12 | B-2 | 4 | 7.8 | 124 | 50 |

In Table 1, the first to fourth repeating units are as follows. For the fourth repeating unit, only $R_6$ of Chemical Formula 4 was illustrated.

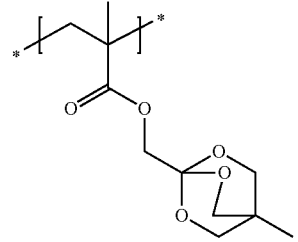
(A-1)

-continued (A-2)
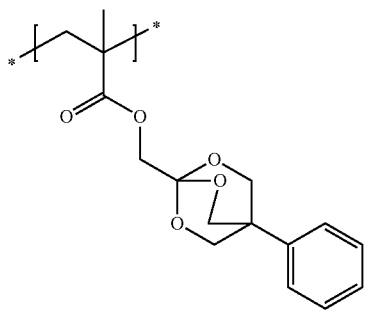

(A-3)
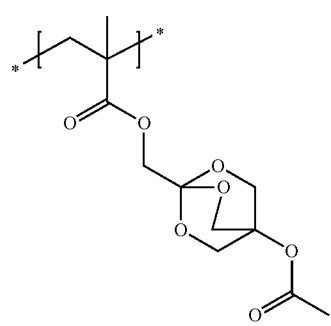

(B-1)
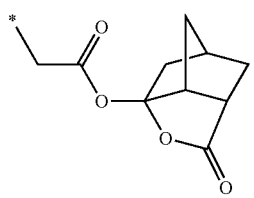

(B-2)
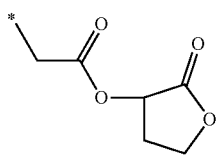

(B-3)
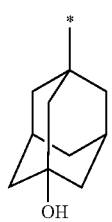

(B-4)
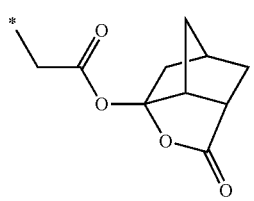

-continued (C)
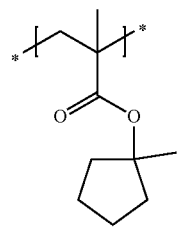

(D)
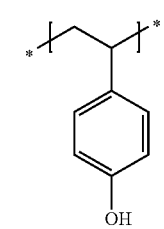

As shown in Table 1, when the photosensitive polymers of Examples 1 to 11 were used, it was confirmed that the remaining thickness ratios were improved by about 10% or more in most cases and by about 15% or more in some cases, as compared with Comparison Examples.

While the inventive concept has been particularly shown and described with reference to some embodiments thereof, it will be understood that various changes in form and details may be made therein without departing from the scope of the inventive concept.

What is claimed is:
1. A photoresist composition comprising:
   a photosensitive polymer;
   a photoacid generator (PAG); and
   a solvent,
   wherein the photosensitive polymer comprises a first repeating unit having a structure of Chemical Formula 1:

<Chemical Formula 1>

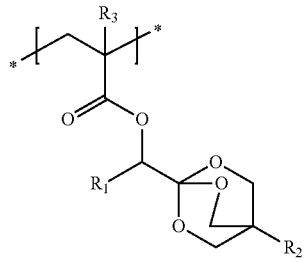

wherein $R_1$ is hydrogen, an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, or a cycloalkenyl group having 3 to 12 carbon atoms, $R_2$ is an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, a cycloalkenyl group having 3 to 12 carbon atoms, or a carboxylate group having 1 to 6 carbon atoms, and $R_3$ is hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms.

2. The photoresist composition of claim 1, wherein the photosensitive polymer further comprises a second repeating unit comprising an acid-labile protecting group.

3. The photoresist composition of claim 2, wherein the second repeating unit has a structure of Chemical Formula 2:

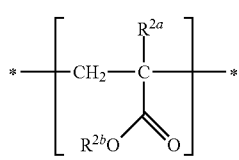

<Chemical Formula 2> wherein $R^{2a}$ is a hydrogen atom, a linear or branched alkyl group having 1 to 6 carbon atoms, a halogen atom, or a linear or branched alkyl halide having 1 to 6 carbon atoms, and $R^{2b}$ is the acid-labile protecting group.

4. The photoresist composition of claim 2, wherein the photosensitive polymer further comprises a third repeating unit having a structure of Chemical Formula 3:

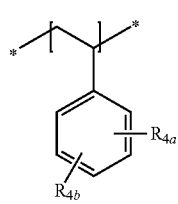

<Chemical Formula 3> wherein $R_{4a}$ is hydrogen, a hydroxyl group, a carboxyl group, an alkyl group having 1 to 10 carbon atoms, a cycloalkyl group having 3 to 12 carbon atoms, or an alkoxy group having 1 to 10 carbon atoms, and $R_{4b}$ is a hydroxyl group or a carboxyl group.

5. The photoresist composition of claim 1, wherein in the photosensitive polymer, a number of first repeating units is about 5% to about 30% of a number of total repeating units.

6. The photoresist composition of claim 1, wherein $R_1$ is hydrogen, a methyl group, an ethyl group, or an aryl group, and $R_2$ is a methyl group, an ethyl group, a propyl group, a methoxy group, an ethoxy group, a propoxy group, an aryl group, a formate group, or an acetate group.

7. The photoresist composition of claim 1, wherein the photosensitive polymer further comprises a fourth repeating unit having a structure of Chemical Formula 4:

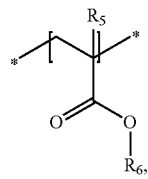

<Chemical Formula 4> wherein $R_5$ is hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms, and $R_6$ is a linear, branched, and/or cyclic saturated or unsaturated hydrocarbon group having 1 to 20 carbon atoms and comprising 1 to 5 heteroatoms or no heteroatom.

8. The photoresist composition of claim 7, wherein in the photosensitive polymer, a total number of first and fourth repeating units is about 10% to about 40% of a number of total repeating units.

9. The photoresist composition of claim 1, wherein the PAG is capable of generating an acid in response to irradiation of light having a wavelength of 13.5 nm.

10. The photoresist composition of claim 1, further comprising a basic quencher in an amount of about 0.01 wt % to about 5 wt % based on a total weight of the photoresist composition.

11. A photoresist composition comprising:

a photosensitive polymer;

a photoacid generator (PAG);

a basic quencher; and a solvent, wherein the photosensitive polymer is a random copolymer comprising a first repeating unit having a structure of Chemical Formula 1, a second repeating unit having a structure of Chemical Formula 2, and a third repeating unit having a structure of Chemical Formula 3:

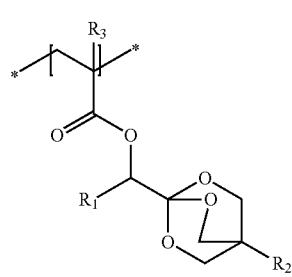

<Chemical Formula 1>

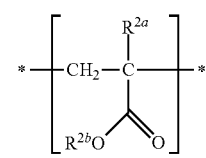

<Chemical Formula 2>

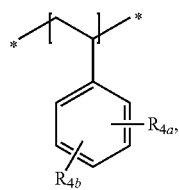

<Chemical Formula 3> wherein $R_1$ is hydrogen, an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, or a cycloalkenyl group having 3 to 12 carbon atoms, $R_2$ is an alkyl group having 1 to 10 carbon atoms, an alkenyl group having 2 to 10 carbon atoms, an alkynyl group having 2 to 10 carbon atoms, an alkoxy group having 1 to 10 carbon atoms, an aryl group having 6 to 15 carbon atoms, a cycloalkyl group having 3 to 12 carbon atoms, a cycloalkenyl group having 3 to 12 carbon atoms, or a carboxylate group having 1 to 6 carbon atoms, $R_3$ is hydrogen, an alkyl group having 1 to 3 carbon atoms, an alkenyl group having 2 to 4 carbon atoms, an alkynyl group having 2 to 4 carbon atoms, an alkoxy group having 1 to 3 carbon atoms, an aryl group having 6 to 10 carbon atoms, a cycloalkyl group having 3 to 7 carbon atoms, or a cycloalkenyl group having 3 to 7 carbon atoms, $R_{4a}$ is hydrogen, a hydroxyl group, a carboxyl group, an alkyl group having 1 to 10 carbon atoms, a cycloalkyl group having 3 to 12 carbon atoms, or an alkoxy group having 1 to 10 carbon atoms, $R_{4b}$ is a hydroxyl group or a carboxyl group, and $R^{2a}$ is a hydrogen atom, a linear or branched alkyl group having 1 to 6 carbon atoms, a halogen atom, or a linear or branched alkyl halide group having 1 to 6 carbon atoms, and $R^{2b}$ is an acid-labile protecting group.

12. The photoresist composition of claim 11, wherein the first repeating unit comprises a solubility adjusting moiety, and a repeating unit having a structure of Chemical Formula 5 or 6 is generated by reacting the solubility adjusting moiety with an acid:

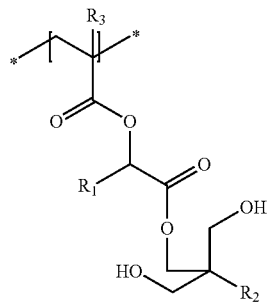

<Chemical Formula 5>

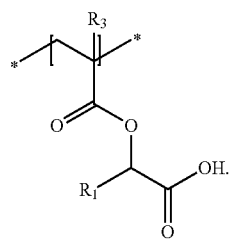

<Chemical Formula 6>

13. The photoresist composition of claim 11, wherein in the photosensitive polymer, a number of first repeating units is about 5% to about 30% of a number of total repeating units, a number of second repeating units is about 35% to about 65% of the number of total repeating units, and a number of third repeating units is about 20% to about 40% of the number of total repeating units.

* * * * *